US012713569B2

(12) United States Patent
Chen et al.

(10) Patent No.: US 12,713,569 B2
(45) Date of Patent: Aug. 18, 2026

(54) APPARATUS FOR PROVIDING AN ELECTRONIC UNIT WITH CLIPS FOR ATTACHMENT TO A PANEL

(71) Applicant: HARMAN INTERNATIONAL INDUSTRIES INCORPORATED, Stamford, CT (US)

(72) Inventors: Jianing Chen, Northville, MI (US); Jon Curry, Commerce Township, MI (US); David Jia, Canton, MI (US)

(73) Assignee: Harman International Industries, Incorporated, Stamford, CT (US)

( * ) Notice: Subject to any disclaimer, the term of this patent is extended or adjusted under 35 U.S.C. 154(b) by 333 days.

(21) Appl. No.: 18/480,449

(22) Filed: Oct. 3, 2023

(65) Prior Publication Data

US 2025/0113469 A1 Apr. 3, 2025

(51) Int. Cl.
*H05K 9/00* (2006.01)
*H05K 7/20* (2006.01)

(52) U.S. Cl.
CPC ......... *H05K 9/0007* (2013.01); *H05K 7/2049* (2013.01); *H05K 7/20854* (2013.01)

(58) Field of Classification Search
CPC ........... H05K 7/20854; H05K 7/20845; H05K 7/2089; H05K 7/209; H05K 7/2049; H05K 9/0007
See application file for complete search history.

(56) References Cited

U.S. PATENT DOCUMENTS

| | | | | |
|---|---|---|---|---|
| 10,188,018 B2 * | 1/2019 | Erbe | H05K 9/0007 | |
| 11,744,052 B2 * | 8/2023 | Müller | H05K 7/20872 | 361/699 |
| 2003/0147204 A1 * | 8/2003 | Koike | H05K 5/0043 | 361/600 |
| 2008/0310124 A1 | 12/2008 | Tu et al. | | |
| 2014/0285972 A1 * | 9/2014 | Hong | H05K 7/209 | 361/707 |
| 2015/0062825 A1 | 3/2015 | Ossimitz et al. | | |
| 2018/0220539 A1 * | 8/2018 | Kaneko | H05K 5/065 | |
| 2021/0105917 A1 * | 4/2021 | Garcia Vila | H02J 7/0042 | |
| 2024/0147641 A1 * | 5/2024 | Yoo | F16B 5/065 | |

FOREIGN PATENT DOCUMENTS

| | | |
|---|---|---|
| DE | 102013223552 A1 | 5/2015 |
| EP | 1562296 A2 | 8/2005 |
| EP | 2916635 B1 | 8/2019 |
| JP | 2001078329 A | 3/2001 |

OTHER PUBLICATIONS

Extended European Search Report for European Application No. 24201595.6, mailed Mar. 11, 2025, 10 pages.

* cited by examiner

*Primary Examiner* — Jayprakash N Gandhi
*Assistant Examiner* — Matthew Sinclair Muir
(74) *Attorney, Agent, or Firm* — Brooks Kushman P.C.

(57) ABSTRACT

An electronics unit including a plurality of electronics positioned therein that generate electromagnetic interference (EMI) and/or thermal energy. The electronics unit may include a housing defining a plurality of openings positioned on a first side thereof, and a plurality of clips attached to the housing. A corresponding clip of the plurality of clips is positioned in a corresponding opening of the plurality of opening for attachment to a vehicle. The plurality of clips enables thermal energy to be transmitted from the plurality of electronics to a first portion of the vehicle, and mitigates the EMI, when the electronics unit is attached to the vehicle.

20 Claims, 9 Drawing Sheets

100
101
108c
102c
108b
121c
113
121b
112
122
121a
111
108c
120
108b
102a 102a
111b
111a
102a
106

123b
106
100
101
112
113
123a 123b
106
108a
108c
108b
111a
111b
105
101
102
100
123a

APPARATUS FOR PROVIDING AN ELECTRONIC UNIT WITH CLIPS FOR ATTACHMENT TO A PANEL

TECHNICAL FIELD

Aspects disclosed herein generally relate to clips for use in establishing, inter alia, a mechanical hold and improving EMC and thermal contact for electronics units. These aspects and others will be discussed in more detail below.

BACKGROUND

Vehicle architecture and overall functionality have evolved over time and increased in complexity, thus requiring more advanced electronic capabilities. With that, comes a desire for finding innovative ways to house and secure electronic modules, for example, to vehicles so as to reduce the space occupied by the modules in the vehicle and also to protect and enhance overall module function.

SUMMARY

In at least one aspect, an apparatus is provided. According to certain embodiments, the apparatus may comprise an electronics unit including a plurality of electronics positioned therein that generate thermal energy. The electronics unit may further include a housing defining a plurality of openings positioned on a first side thereof, and a plurality of clips being attached to the housing, wherein a corresponding clip of the plurality of clips is positioned in a corresponding opening of the plurality of openings for attachment to the vehicle, and wherein the plurality of clips enables thermal energy to be transmitted from the electronics to a first portion of the vehicle.

In another aspect, an apparatus is provided. According to certain embodiments, the apparatus may comprise an electronics unit including a plurality of electronics positioned therein that generate electromagnetic interference (EMI). The electronics unit may further include a housing defining a plurality of openings positioned on a first side thereof, and a plurality of clips being attached to the housing, wherein a corresponding clip of the plurality of clips is positioned in a corresponding opening of the plurality of opening for attachment to the vehicle, and wherein the plurality of clips mitigates the EMI, when the electronics unit is attached to the vehicle.

In another aspect, an electronics unit is provided. According to certain embodiments, the electronics unit may comprise a plurality of electronics positioned therein that generate electromagnetic interference (EMI); a housing defining a plurality of openings positioned on a first side thereof; and a plurality of clips being attached to the housing, wherein a corresponding clip of the plurality of clips is positioned in a corresponding opening of the plurality of opening for attachment to the vehicle, and wherein the plurality of clips (i) enables thermal energy to be transmitted from the plurality of electronics to a first portion of the vehicle, and (ii) mitigates the EMI, when the electronics unit is attached to the vehicle.

DETAILED DESCRIPTION

Figure 1:
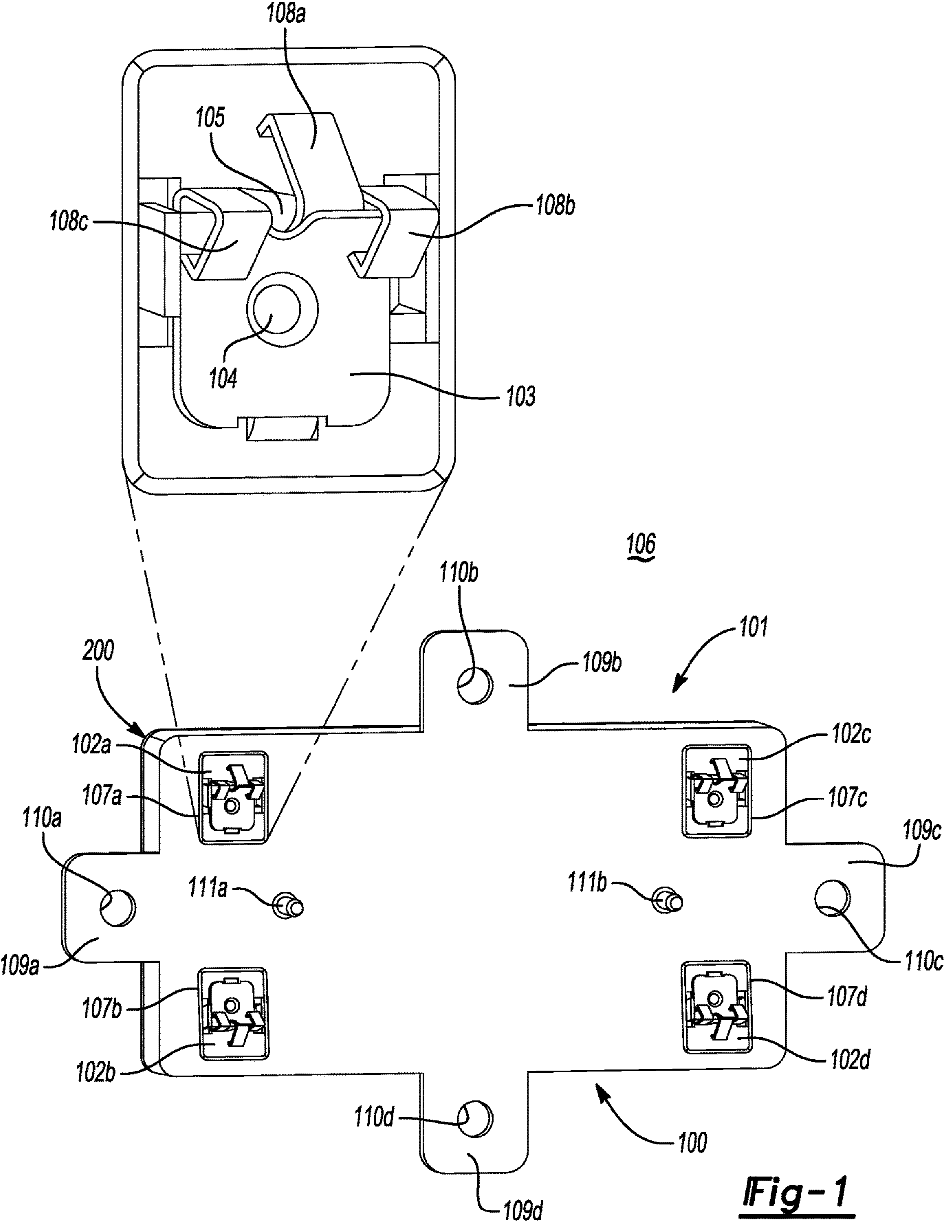
FIG. 1 illustrates an electronics unit in accordance with one embodiment.

As required, detailed embodiments of the present invention are disclosed herein; however, it is to be understood that the disclosed embodiments are merely exemplary of the invention that may be embodied in various and alternative forms. The figures are not necessarily to scale; some features may be exaggerated or minimized to show details of particular components. Therefore, specific structural and functional details disclosed herein are not to be interpreted as limiting, but merely as a representative basis for teaching one skilled in the art to variously employ the present invention. It is recognized that one or more of the Figures may include reference to similar reference numerals and these reference numerals may be similar to one another unless otherwise stated. Similarly, if the reference numerals are introduced with one or more of the Figures, such reference numerals may not be referenced for other Figures where they appear if there is no change in their respective function and/or structure.

Provided herein are clips for holding a unit in place on a panel so that fasteners may be tightened to secure the unit on the panel. In one example, the panel may be used in connection with panels that are utilized in a vehicle. The clips may be made of, for example, metal including but not limited to, steel sheet metal, etc. The clips may provide a spring and/or clamp-like function that couples any housing or body that are attached to the clips to the vehicle. In one example, an electronics-based module (or electronic unit)

may include the disclosed clips. The clips may also provide robust electromagnetic compatibility (EMC) and thermal contact between the electronics-based module and the panel.

As noted above, the clips may hold or fix the electronic units to the panel. Non-limiting examples of electronics units may include infotainment head units, instrument panel modules (or instrument panel control units), navigation modules (or navigation control units), audio control units, on-board charging devices, etc. It is recognized that the type of electronic unit that includes the disclosed clips may vary based on the desired criteria of a particular implementation. In general, the disclosed clips may be utilized in connection with any electronic unit that emits electromagnetic energy and thermal energy. Further, the disclosed clips may be arranged to fix the electronic unit of any size to one or more panels of the vehicle.

In general, traditional electronic units without the use of clips may be difficult to mount to a panel based on gravity and/or the accessibility for the installer. Clips purchased from external suppliers may be bulky due to their attachment features and may not be cost effective. The disclosed clip may be integrated into the housing of an electronics unit and may include a snap-fit feature, which may be easy to insert into the panel without requiring any additional tools. The housing may also be referred to as a "chassis". The housing or chassis may be formed as a single piece or as multiple parts that may be fitted together. Commonly, the housing or chassis may consist of two parts. The clips may be used where space is constrained and may include flexible (or spring like) tabs to provide a robust hold for mechanical retention on the panel. The clips may have a reduced overall footprint when compared to existing clips. In addition, the disclosed clips may temporarily hold the electronic unit to the panel while primary fasteners are used to further couple the electronic unit to the panel. As noted above, the clips may additionally facilitate secure attachment of a unit to a panel while improving heat dissipation and providing EMI protection.

Some implementations for various clips include one or more blades that bend in a particular orientation that may leave an opening of a housing of an electronic unit which exposes the unit to the environment. Such an opening allows dust or other particles to enter through the housing and come into contact with various electronics in the electronic unit which may degrade performance of the electronic unit. The clips described herein eliminate this opening, thus protecting the electronics in the unit from dust and other environmental particles or contaminants.

FIG. 1 illustrates a bottom view of an electronics unit 100 that includes a plurality of clips 102*a*-102*d* (or "102") as will be further described herein. While the electronics unit 100 generally includes a total of four clips (102*a*-102*d*), it is recognized that the disclosed electronic unit 100 may include any number of clips 102. Each clip 102 may be formed of metal, etc. The electronics unit 100 generally includes a housing 101. In one example, the housing 101 may undergo die casting and be formed of metal. Further, the housing 101 may be formed of various non-ferrous metals such as, but not limited to, zinc, copper, aluminum, magnesium, lead, pewter, tin-based alloys, etc. The housing 101 may alternatively be formed of ferrous metals or plastics. The electronics unit may further include electronics 200 positioned in the electronics unit 100 that generate heat and are susceptible to generating electromagnetic interference. The electronics may be positioned within the housing 101.

It is recognized that the housing 101 may include a plurality of recesses 107*a*-107*d* ("107") on any side thereof. The recesses 107*a*-107*d* may receive a corresponding clip 102*a*-102*d*, respectively. Each clip 102 includes a base 103 having an aperture 104. A fastener (not shown) may be received by the aperture 104 to fasten the clip 102 to an outer surface of the housing 101. In one example, the fastener may be a clinch nut or other similar mechanism. Alternatively, the clips 102 may be formed without the aperture 104 and the fastener (not shown) may be driven into the clip 102 to secure the clip 102 to an outer surface of the housing 101. In one example, a clinch nut and screw may be used to secure the clip 102 to the housing 101.

Each clip 102 further includes a support 105 that extends outwardly from the base 103. In general, the support 105 and the base 103 may be formed on different planes from one another.

As shown, each clip 102 includes a plurality of projections 108*a*-108*c* ("108"). It is recognized that the number of projections 108 positioned on the housing 101 may vary based on the desired criteria of a particular implementation. The plurality of projections 108*a*-108*c* extend outwardly away from the outer surface of the base 103 and/or the support 105 for insertion into the panel 106. For example, the projection 108*a* extends outwardly from an end of the support 105 and is angled to extend toward the base 103, where an outer end of the projection 108*a* is positioned directly over the base 103. Similarly, the projections 108*b* and 108*c* extend outwardly from an end of the base 103 and are angled to extend toward the support 105, where an outer end of the projections 108*b* and 108*c* are positioned directly over the support 105. Each of the projections 108 are spring-like and are configured to flex upon insertion to the panel. As also shown, the projection 108*a* as positioned on the support 105 is offset from the position of the projections 108*b* and 108*c* on the support 105. Thus, in this regard, the projection 108*a* is not positioned directly across from the projections 108*b* and 108*c*.

As shown, the housing 101 of the electronics unit 100 may include a plurality of extensions 109*a*-109*d* ("109"). Each extension 109*a*-109*d* may include an aperture 110*a*-110*d* ("110"), respectively. A fastener (not shown) may be received by the aperture 110 to fasten the electronics unit 100 to a panel 106 (not shown). It is recognized that the housing 101 may also be formed without extensions 109, and that the apertures 110 used for fastening the electronics unit 100 to a panel 106 may instead be formed on the main body of the housing 101 rather than on the extensions 109. The housing 101 further include a plurality of indexing pins 111*a*, 111*b* ("111") extending outward from the bottom surface of the housing 101 that may serve as a guide to align the electronics unit on a panel 106 (not shown).

Figures 2, 3:
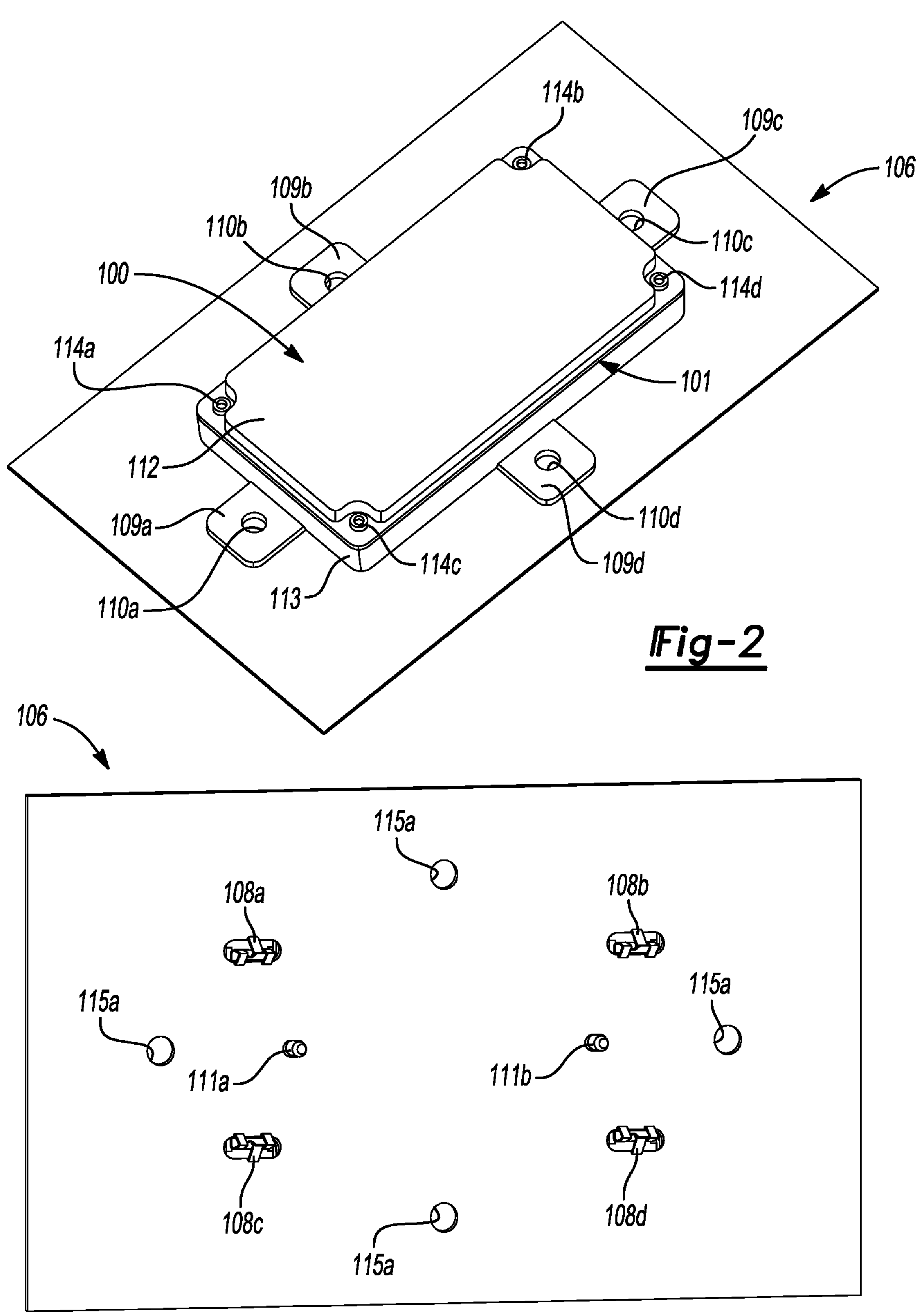
FIG. 2 illustrates a top view of an electronics unit fitted with the clips installed onto a sheet metal panel in accordance with one embodiment.
FIG. 3 illustrates a bottom view of the electronics unit of FIG. 2 installed onto the sheet metal panel in accordance with one embodiment.

FIG. 2 illustrates a top view of an electronics unit 100 including the clips 102 according to an embodiment. The electronics unit 100 is shown aligned on a panel 106. The panel 106 may be of a shape and size suitable to receive the shape and size of an electronics unit 100 including the clips 102 according to various embodiments. Additionally, the panel 106 may be formed of metal. For example, the panel 106 may be formed of sheet metal. Alternatively, the panel 106 may be formed of plastic. As depicted, the housing 101 may be die cast. For example, the housing 101 may be formed by aluminum casting. As shown, the housing 101 may be formed as two parts, a top casing 112 and a bottom casing 113. The top 112 and bottom 113 casings may be formed separately and subsequently fitted together. The clips 102 may be fastened to the bottom casing 113 via a clinch fit mechanism. The top casing 112 may be fastened to the bottom casing 113 via a plurality of fasteners 114*a*-114*d*

("114"). The top casing 112 may be fastened to the bottom casing 113 after the clips 102 have been fastened to the bottom casing 113, and after the electronics unit 100 has been fitted into the housing 101. Alternatively, the top casing 112 may be fastened to the bottom casing 113 via interference fit.

Referring still to FIG. 2, the bottom casing 113 may include a plurality of extensions 109*a*-109*d* ("109") having apertures 110*a*-110*d* ("110"). The apertures 110 may receive fasteners (not shown) to fasten the bottom casing 113 to the panel 106.

FIG. 3 illustrates a bottom view of the electronics unit 100 depicted in FIG. 2 installed onto the panel 106. As shown, the projections 108*a*-108*d* ("108") of the clips 102 protrude through the bottom of the panel 106. The outer ends of the projections 108 may compress inward upon insertion into the panel 106. The projections 108 may retract or spring back in response to being fully received into the panel 106, thereby retaining the clips 102 and thus the housing 101 fixed to the panel 106. The indexing pins 111*a*-111*b* extend outwardly from the bottom casing 113 (see FIG. 2) through the panel 106. The pins 111 may serve as a guide to align the housing 101 on the panel 111. The clips 102 may then be inserted through the panel 106 so that the electronics unit 100 will be held in alignment on the panel 106. Fasteners (not shown) may then be inserted through the apertures 109 on the housing 101 and through apertures 115*a*-115*d* ("115") on the panel 106. The apertures 115 on the panel 106 may be aligned with the apertures 109 on the bottom casing 113 of the housing 101.

Figure 4:
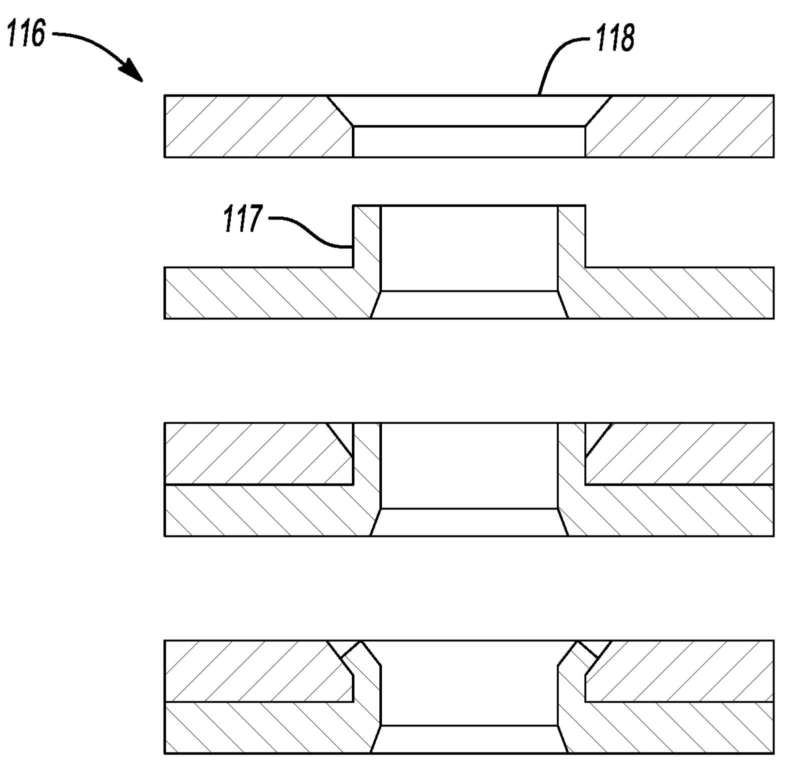
FIG. 4 illustrates the riveting process used to install a clinch fastener into a clip in accordance with one embodiment.

FIG. 4 illustrates an example of a process by which the clips 102 may be installed into the bottom casing 113 of the housing 101 in accordance with one embodiment. The process may be a clinching process. In one example, a fastener (not shown) may be placed into the aperture 104 and drilled through the base 103 of the clip 102. The fastener may be a clinch nut or other similar mechanism. As shown, when parallel pressure is applied to the clinch nut 116, the clinch nut 116 may displace the material 117 around the aperture 104 on the base 103 of the clip 102 thereby causing the material 117 to flow into a recess 118 of the clinch nut 116 to hold the clinch nut 116 in place. The fastener may then be used to secure the clip 102 onto the bottom surface of the bottom casing 113 of an electronics unit 100. Alternatively, the clip 102 may be joined to the bottom casing 113 of the housing 101 by a rivet or by a screw.

Figure 5:
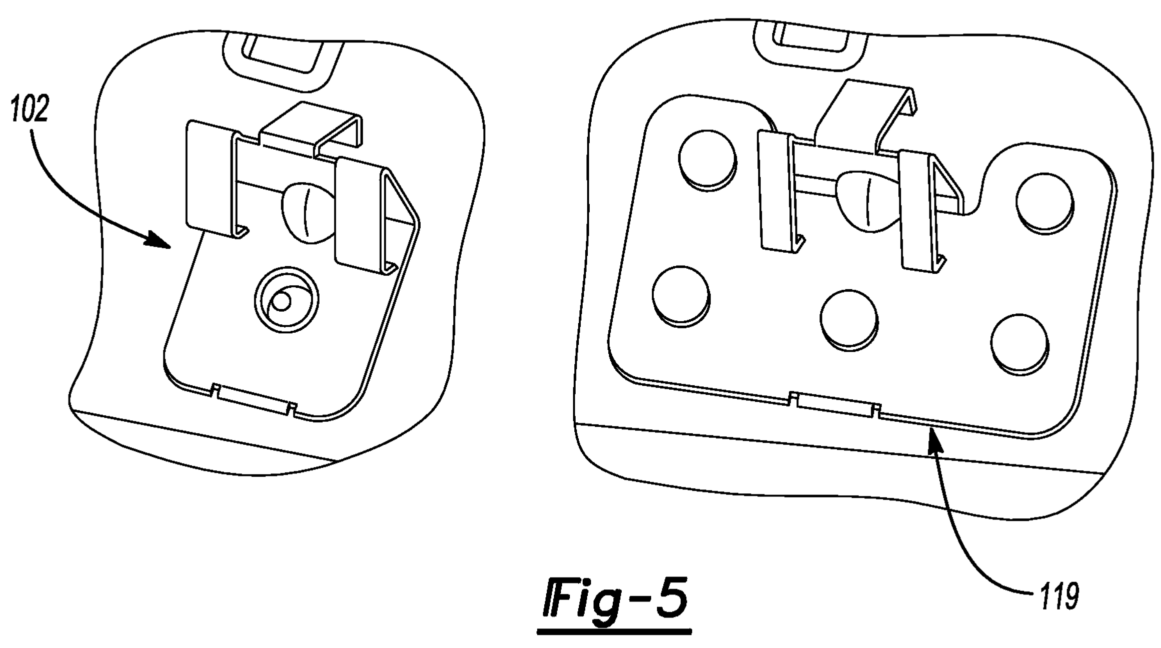
FIG. 5 illustrates the metal clip of FIGS. 1-3, and a clip in accordance with one embodiment.

FIG. 5 illustrates the clip 102 of FIGS. 1-3, and an alternate embodiment of a clip 119 according to the disclosures herein. The thickness of the base 103 may be from 0.1 mm to 0.4 mm. The width of the base 103 may be from 7.5 mm to 11.5 mm. The width of the projections may be from 0.8 to 4.5 mm. For example, the clip 102 depicted in FIG. 5 has a base with a thickness of 0.3 mm and a width of 10.5 mm. The projection 108*a* has a width of 3.0 mm. The projections 108*b*, 108*c* have a width of 2.5 mm. Alternatively, the clip 119 has a base with a thickness of 0.3 mm and a width of 8.5 mm. The projection 108*a* has a width of 3.0 mm and the projections 108*b*, 108*c* have a width of 1.5 mm. The base 103 may have at least one aperture 104 through which a fastener may be inserted to fasten the clips 102/119 to a surface of the housing 101 of the module. For example, the clip 102 is depicted with one aperture 104, whereas the clip 119 is depicted with five apertures.

One or more of the clips 102, 119 may be used to secure an electronics unit 100 to a panel 106. It is recognized that the number of clips 102, 119 used may vary depending on the size, shape and/or weight of the unit to be secured. The number of clips 102, 119 implemented may also vary depending on the need of a particular electronics unit 100 for support. For example, a small light unit with little need for support may require only one clip. In the alternative, a larger heavier unit may require four, five, six, etc. clips.

Figure 6:
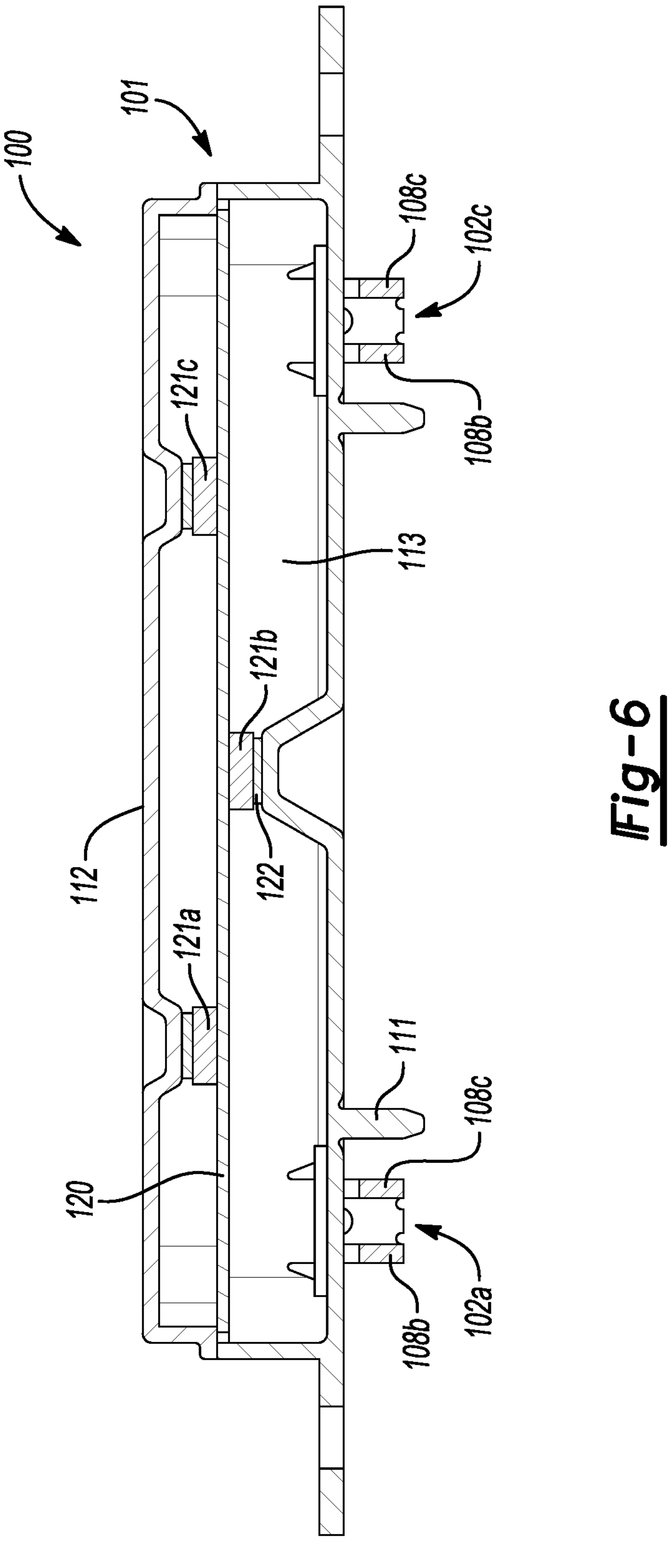
FIG. 6 illustrates a cross-section view of an electronics unit fitted with the clips in accordance with one embodiment.

FIG. 6 illustrates a cross-section view of an electronics unit 100 including clips 102 according to an embodiment. The electronics unit 100 includes a top casing 112 and a bottom casing 113. The electronics unit 100 may further include a printed circuit board (PCB) 120 disposed between the top casing 112 and the bottom casing 113. The electronics unit 100 may additionally include integrated circuits (IC) 121*a*-121*c* ("121") in electronic communication with the PCB 120. The ICs 121 may be connected to the PCB via soldering, etc. The electronics unit 100 may also include a thermal interface or thermal gap fillers 122. Further, curing or non-curing fluid or viscous materials such as polymer-based materials, putty pads, viscoelastic, etc. may be used to form the thermal interface or the thermal gap fillers 122. It is recognized that the type and number of circuit boards and/or circuits may vary depending on the particular application.

Figure 7:
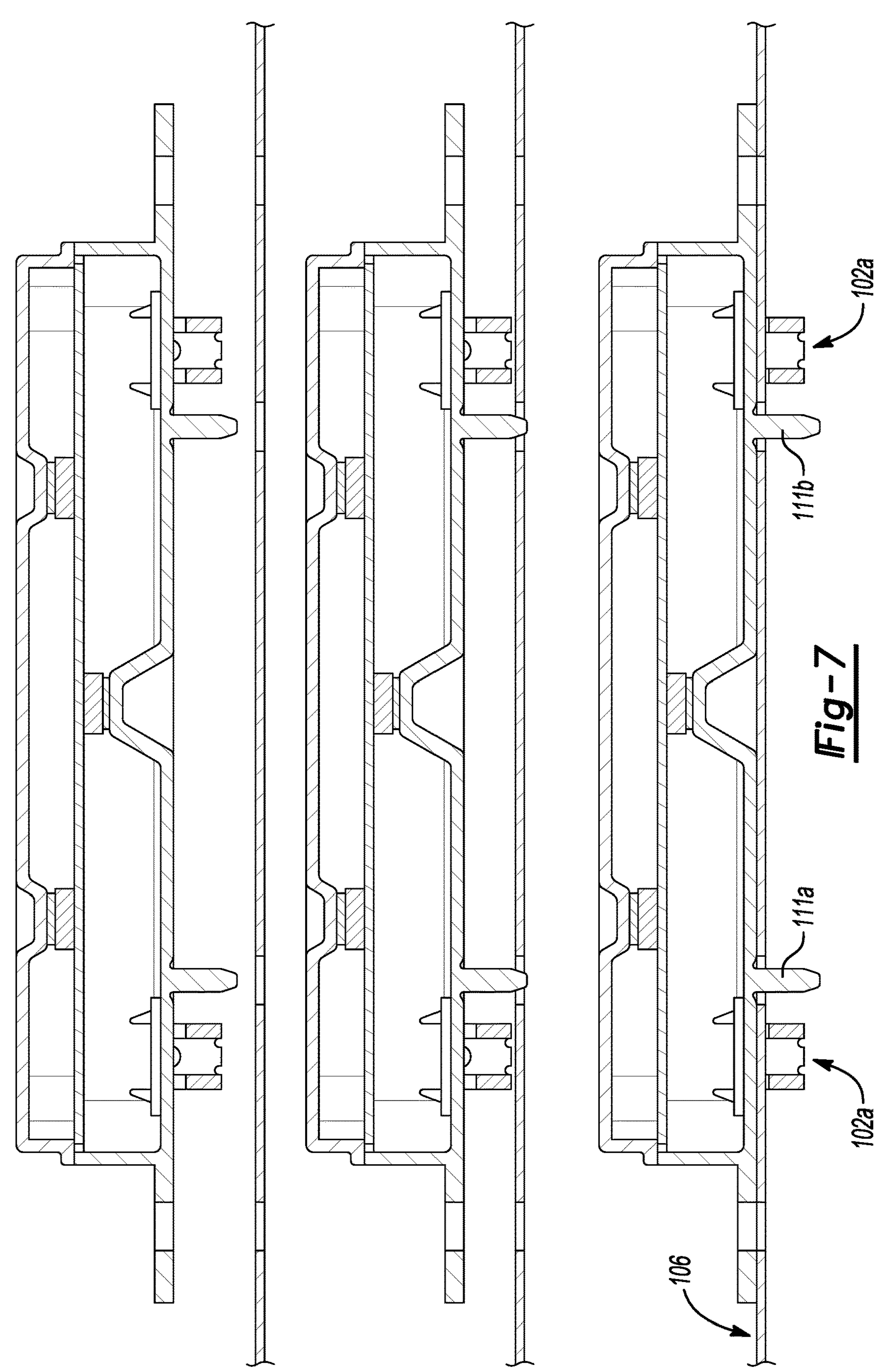
FIG. 7 illustrates a method for installing an electronics unit fitted with the clips onto a sheet metal panel in accordance with one embodiment.

FIG. 7 illustrates a method for installing an electronics unit 100 including clips 102 according to an embodiment onto the panel 106. As depicted, an electronics unit 100 similar to that of FIG. 6 is aligned onto the panel 106. As shown, the panel 106 is a vehicle panel 106. The indexing pins 111*a*, 111*b* and the clips 102 on the bottom surface of the bottom casing 113 are inserted through the vehicle panel 106 to secure the electronics unit 100 to the panel 106. Fasteners (not shown) may then be inserted through the apertures 110 in the housing 101 and the apertures 115 in the panel 106 to secure the electronics unit 100 to the panel 106.

It is recognized that the electronics unit 100 may be removed from the panel 106. For example, the electronics unit 100 may need to be removed from the panel 106 to perform repairs to the electronics unit 100. To remove the electronics unit 100 from the panel 106, the fasteners inserted through the apertures 110 in the housing 101 and the apertures 115 in the panel may be removed. Next, the clips 102 may be separated from the panel 106 by exerting a pulling force. The pulling force required to separate the clips 102 from the panel 106 may be between 30 and 50 newtons. For example, the force required to pull the clips 102 from the panel 106 may be 30, or 35, or 40, or 45, or 50 newtons. The force required may vary depending on the materials of the clips 102, housing 101, and panel 106, as well as on the dimensions of the projections 108.

Figure 8:
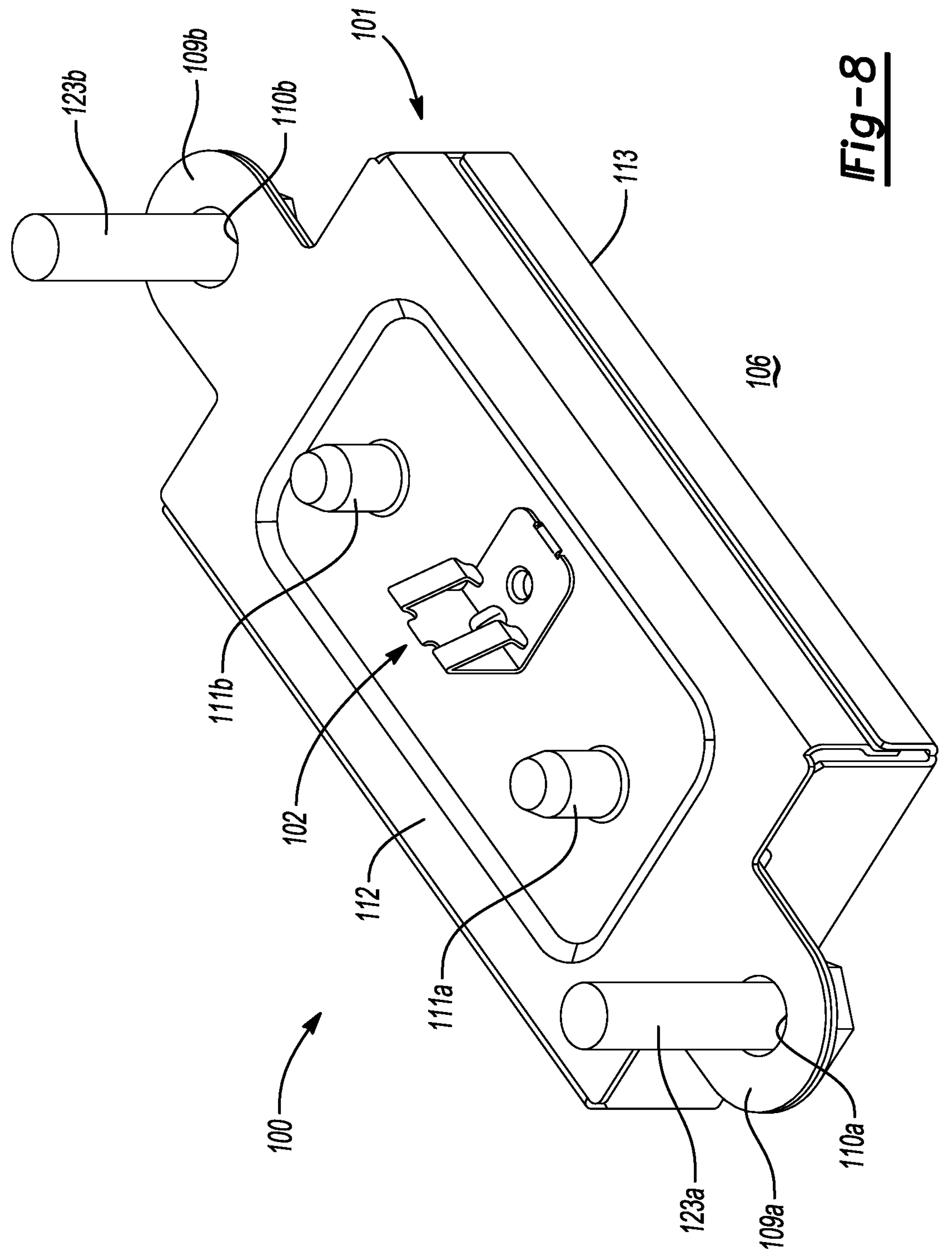
FIG. 8 illustrates an alternate embodiment of an electronics unit fitted with the clip in accordance with one embodiment.

FIG. 8 illustrates a bottom view of an electronics unit 100 including a clip 102 according to another embodiment. As shown, the electronics unit 100 has a housing 101. The housing 101 may have a top casing 112 and a bottom casing 113. As depicted, the top casing 112 and the bottom casing 113 are formed from sheet metal. The bottom casing 113 may include extensions 109*a*, 109*b* ("109") with an aperture 110*a*, 110*b* ("110"). The apertures 110 may receive fasteners 123*a*, 123*b* to secure the electronics unit 100 to a panel 106. The bottom casing 113 of the housing 101 may also include indexing pins 111*a*, 111*b* ("111") extending outwardly from the bottom casing 113. The indexing pins 111 may serve as a guide to align the housing 101 on the panel 106 as the fasteners 123*a*, 123*b* are applied to the electronics unit 100 to fix the electronics unit 100 to the panel 106.

Figures 9, 10:
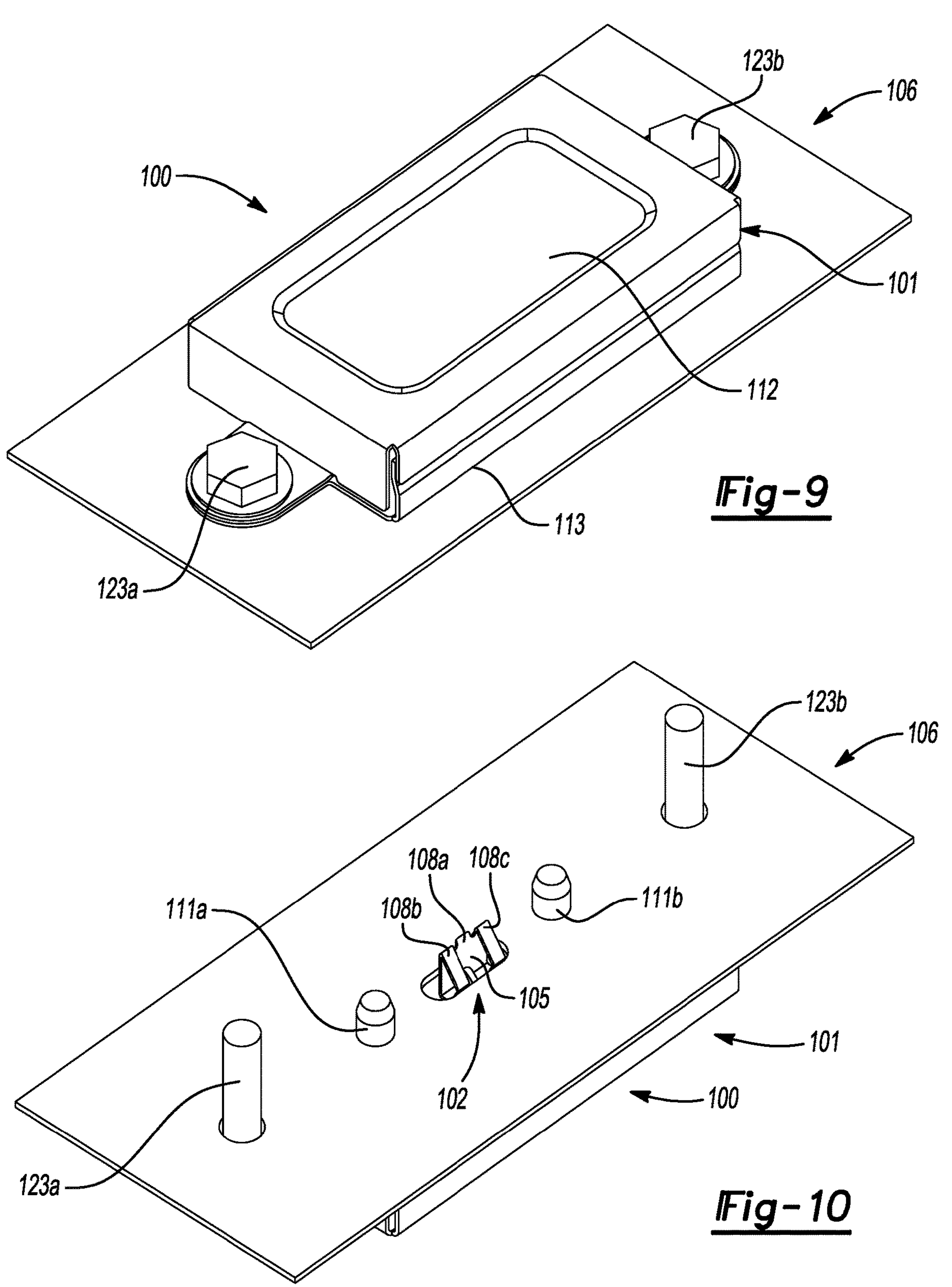
FIG. 9 illustrates a top view of the electronics unit of FIG. 8 installed on a sheet metal panel in accordance with one embodiment.
FIG. 10 illustrates a bottom view of the electronics unit of FIG. 8 installed on a sheet metal panel in accordance with one embodiment.

FIG. 9 illustrates a top view of the electronics unit 100 of FIG. 8 installed on a panel 106. The apertures 110 on the extensions 109 of the bottom casing 113 are shown with fasteners 123. The fasteners 123 may be used to secure the electronics unit 100 to the panel 106.

FIG. 10 illustrates a bottom view of the electronics unit 100 of FIG. 8 installed on a panel 106. The support 105 and the projections 108 of the clip 102 protrude through the panel 106. In addition to the support 105 and projections 108 of the clip 102, the indexing pins 111 and the fasteners 123 protrude through the panel to secure the electronics unit 100 to the panel 106.

Figure 11:
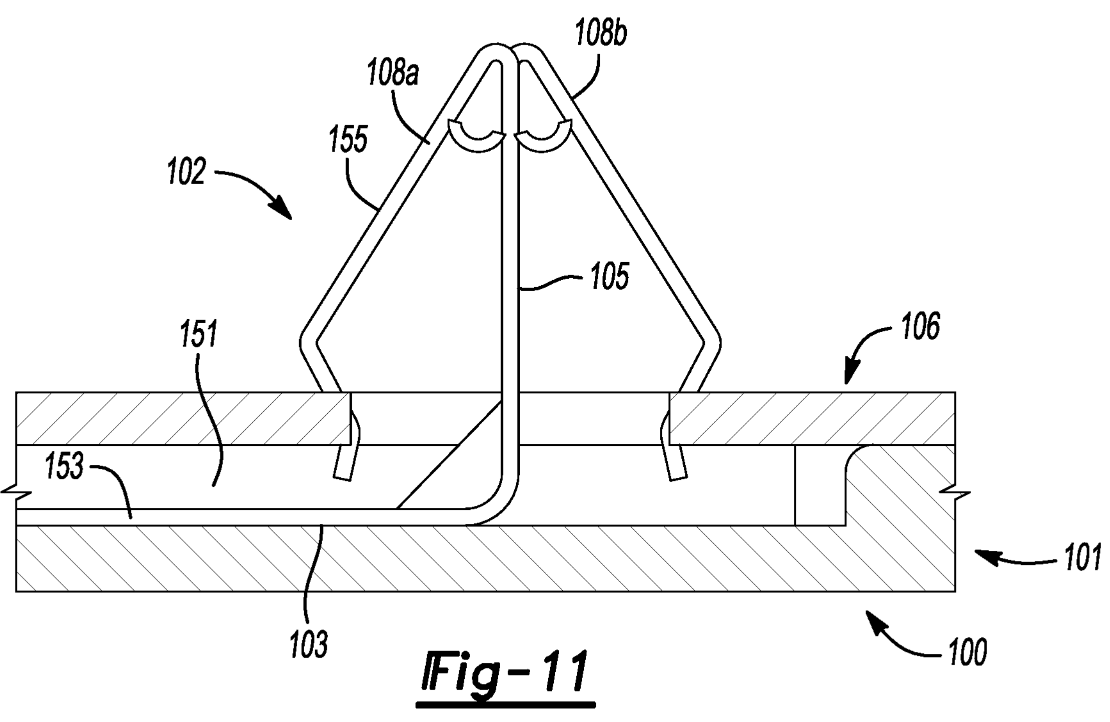
FIG. 11 illustrates a side view of a portion of an electronics unit with, for example, a die cast-based housing including a clip installed on a sheet metal panel in accordance with one embodiment.

FIG. 11 illustrates a side view of a portion of an electronics unit 100 including a clip 102 installed on a sheet metal panel 106 in accordance with one embodiment. The base 103 of the clip 102 is attached to the housing 101. In this case, the housing 101 is formed from die cast metal. The support 105 and the projections 108*a* and 108*b* protrude through the panel 106 to secure the electronics unit 100 to the panel 106. The outer ends of the projections 108 may compress inward upon insertion into the panel 106. The projections 108 may then retract or spring back in response to being fully received into the panel 106, thereby retaining the clips 102 and thus the housing 101 fixed to the panel 106. While noted and shown in connection with FIG. 1 but not fully shown in FIG. 11, the projection 108*a* as positioned on the support 105 is offset from the position of the projections 108*b* and 108*c* on the support 105.

As shown, the base 103 and the support 105 are generally formed at an angle of roughly 90 degrees relative to one another. The housing 101 generally defines an elongated channel 151 that may be formed on an outer portion thereof. The base 103 includes an extending member 153 for being received within the elongated channel 151 of the housing 101. The base 103 and thus the extending member 153 is generally parallel to the panel 106. The extending member 153 may be fixed within the elongated channel 151 to attach the clip 102 to the housing 101. The projection 108*a* includes a first member 155 that extends outwardly from the support 105. The first member 155 is generally formed at an angle of roughly 45 degrees or less relative to the support 105 after full insertion of the clip 102 into the panel 106. It may be desirable to maintain an angle of roughly 45 degrees or less with respect to the first member 155 and the support 105 to provide a smaller aperture within the panel 106.

It is also recognized that the extending member 153 of the base 103 extends past the first member 155 of the projection 108 to ensure that the base 103 is seated or completely fixed to the housing 101. This also ensure that the base 103 remains coupled or attached to the housing 101 in the event an operation attempts to separate the clip 102 from the housing 101 in an attempt to remove the electronics unit 100. It is recognized that in other embodiments the base 103 may include an extending member 153 positioned on each side thereof to further aid in retaining the clip 102 to the housing 101. In this instance, the extending member 153 may extend past the first member 155 of the projection 108*b*. It is further recognized that each projection 108 may include the first member 155.

Figure 12:
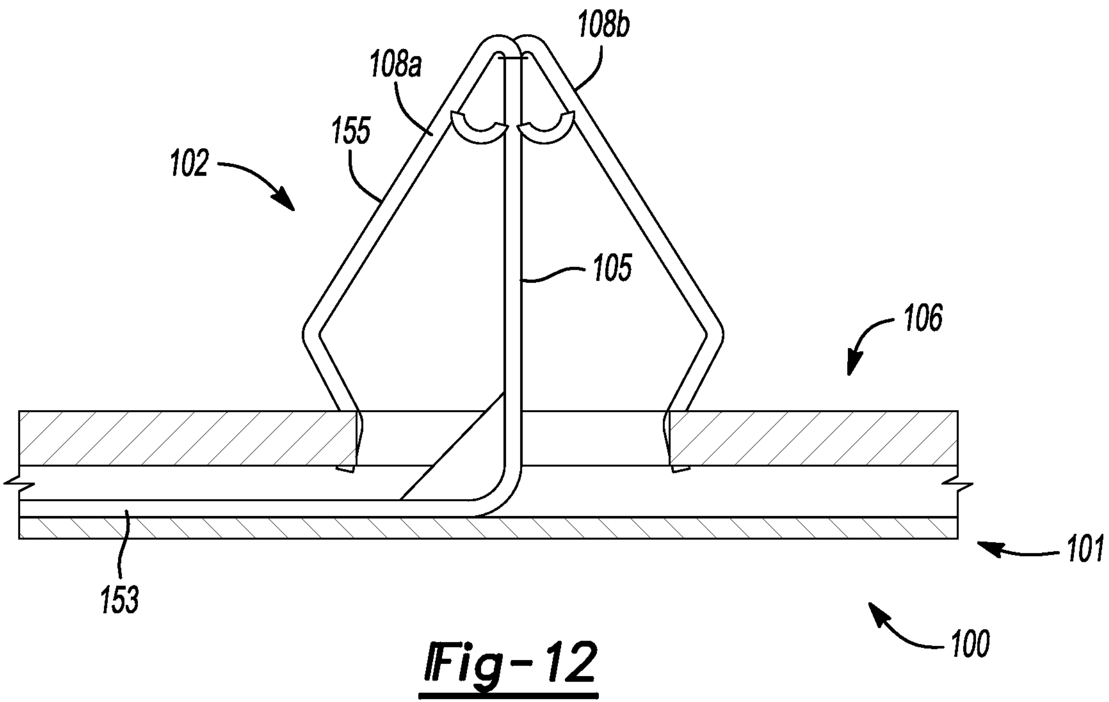
FIG. 12 illustrates a side view of a portion of an electronics unit with a sheet metal-based housing including a clip installed on a sheet metal panel in accordance with one embodiment.

FIG. 12 illustrates a side view of a portion of an electronics unit 100 including a clip 102 installed on a sheet metal panel 106 in accordance with one embodiment. The base 103 of the clip 102 is attached to the housing 101. As depicted, the housing 101 is formed from sheet metal. The support 105 and the projections 108*a* and 108*b* protrude through the panel 106 to secure the electronics unit 100 to the panel 106. The outer ends of the projections 108 may compress inward upon insertion into the panel 106. The projections 108 may retract or spring back in response to being fully received into the panel 106, thereby retaining the clips 102 and thus the housing 101 fixed to the panel 106.

Figure 13:
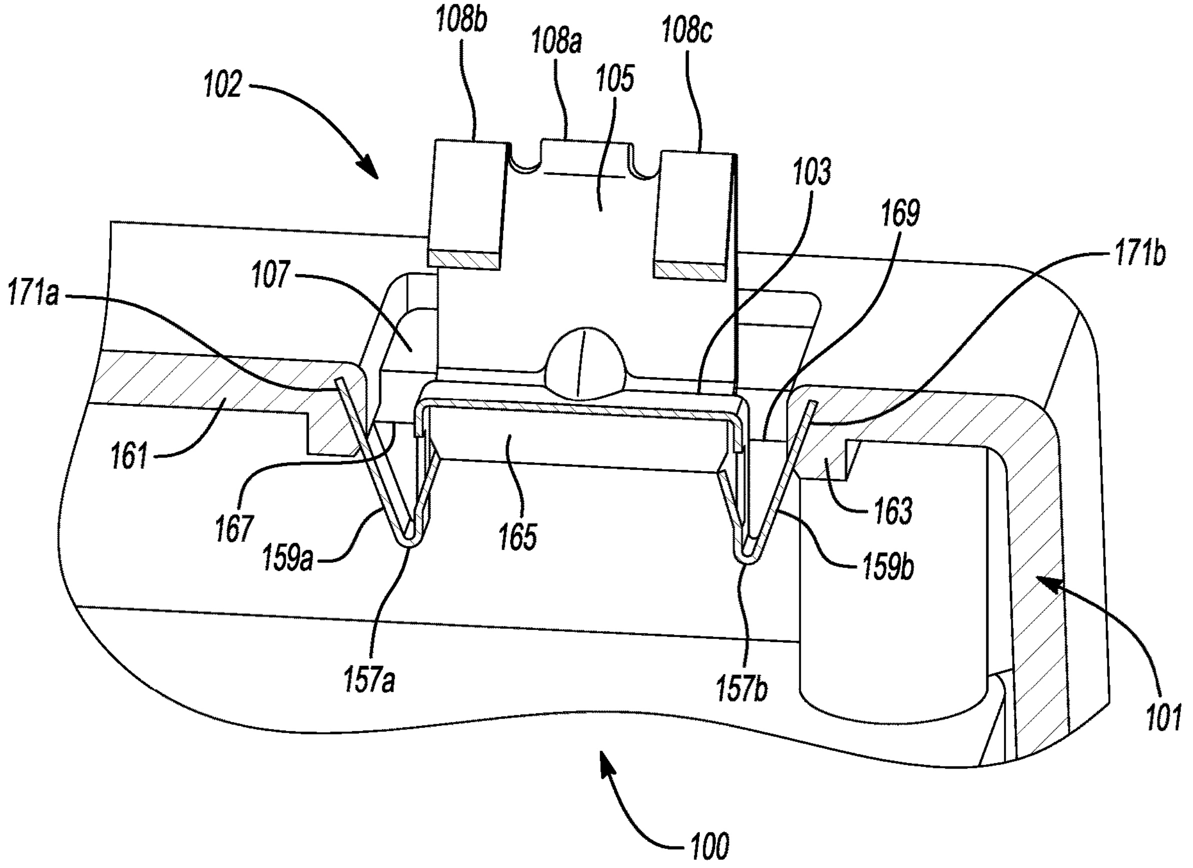
FIG. 13 illustrates a cross section view of an electronics unit with a die cast-based housing including a clip in accordance with one embodiment.

FIG. 13 illustrates a cross section view of a clip 102 attached to a housing 101 according to another embodiment. In one example, the housing 101 may be die-cast. A pair of projections 157*a*, 157*b* extend outwardly from a surface of the base 103 in a direction generally opposite that of the support 105. The projections 157*a*, 157*b* protrude through the housing 101 to attach the base 103 of the clip 102 to the housing 101 via an interference fit. The projections 157*a*, 157*b* include a first member 159*a*, 159*b* that extends outwardly from an end of the projection opposite to the base 103. The first member 159*a*, 159*b* is generally formed at an angle of roughly 45 degrees or less relative to an end of the projection 157*a* or 157*b* after attachment of the clip 102 into the housing 101.

The housing 101 includes a recess 107 for receiving the clip 102. In one example, the recess 107 includes a first ledge 161, a second ledge 163, and a tab 165. The tab 165 is positioned between the first ledge 161 and the second ledge 163. The first ledge 161 and one portion of the tab 165 define a first opening 167 for receiving the first projection 157*a*. The second ledge 163 and another portion of the tab 165 define a second opening 169 for receiving the second projection 157*b*. To couple the clip 102 to the recess 107 (or housing 101), the first projection 157*a* is spring like and compresses against the first ledge 161 as the clip 102 is inserted into the housing 101. Similarly, the second projection 157*b* is spring like and compresses against the second ledge 163 as the clip 102 is inserted into the housing 101. Once each of the first projection 157*a* and the second projection 157*b* are moved past the first ledge 161 and the second ledge 163, respectively, the first projection 157*a* and the second projection 157*b* spring outwardly past the first ledge 161 and the second ledge 163 (e.g., in opposite directions), where upper portions 171*a*, 171*b* of the first projection 157*a* and the second projection 157*b* abut an underside of the housing 101 to keep the clip 102 attached to the housing 101.

While exemplary embodiments are described above, it is not intended that these embodiments describe all possible forms of the invention. Rather, the words used in the specification are words of description rather than limitation, and it is understood that various changes may be made without departing from the spirit and scope of the invention. Additionally, the features of various implementing embodiments may be combined to form further embodiments of the invention.

What is claimed is:

1. An electronics unit comprising:

a plurality of electronics positioned therein that generate electromagnetic interference (EMI);

a housing defining a plurality of openings positioned on a first side thereof; and a plurality of clips being attached to the housing, wherein a corresponding clip of the plurality of clips is positioned in a corresponding opening of the plurality of openings for attachment to a vehicle, wherein each clip includes a base, a support extending outwardly from the base, and a first projection and a second projection both extending from a distal end of the support toward the base at an angle of 45 degrees or less relative to the support when the clip is fully seated into an opening of a panel, and wherein outer ends of the first projection and the second projection are configured to compress inward toward the support upon insertion into the panel and retract or spring back in response to being fully received into the panel, thereby retaining the plurality of clips and the housing fixed to the panel, and wherein the plurality of clips (i) enables thermal energy to be transmitted from the plurality of electronics to a first portion of the vehicle, and (ii) mitigates the EMI, when the electronics unit is attached to the vehicle.

2. The electronics unit of claim 1, wherein the plurality of clips are clinched to the housing to fix the plurality of clips to the housing.

3. The electronics unit of claim 1, wherein the plurality of clips reduce EMI generated by the plurality of electronics by providing robust electromagnetic compatibility (EMC) between the electronics-based module and the panel.

4. The electronics unit of claim 1, wherein the plurality of clips enable thermal energy to be transmitted from the electronics to a first portion of the vehicle by providing thermal contact between the electronics module and the panel.

5. The electronics unit of claim 1, wherein the plurality of clips may be separated from the panel to perform repairs to the electronics unit by exerting a pulling force.

6. The electronics unit of claim 5, wherein the pulling force required to separate the clips from the panel is between 30 and 50 newtons.

7. An apparatus comprising:

an electronics unit including a plurality of electronics positioned therein that generate thermal energy, the electronics unit further including:

a housing defining a plurality of openings positioned on a first side thereof; and a plurality of clips being attached to the housing, wherein a corresponding clip of the plurality of clips is positioned in a corresponding opening of the plurality of openings for attachment to a vehicle, wherein each clip includes a base, a support extending outwardly from the base, and a first projection and a second projection both extending from a distal end of the support toward the base at an angle of 45 degrees or less relative to the support when the clip is fully seated into an opening of a panel, and wherein outer ends of the first projection and the second projection are configured to compress inward toward the support upon insertion into the panel and retract or spring back in response to being fully received into the panel, thereby retaining the plurality of clips and the housing fixed to the panel, wherein the plurality of clips enables thermal energy to be transmitted from the electronics to a first portion of the vehicle.

8. The apparatus of claim 7, wherein the plurality of clips, when attached to the first portion of the vehicle, reduce electromagnetic interference generated by the plurality of electronics.

9. The apparatus of claim 7, wherein each clip includes at least three projections that protrude from the corresponding opening and wherein the first projection and the second projection extend in opposite directions from the support.

10. The apparatus of claim 1, wherein the first projection as positioned on the support is offset from the second projection as positioned on the support.

11. The apparatus of claim 7, wherein the plurality of clips each has a width of about 7.5 mm to about 11.5 mm and a thickness of about 0.1 mm to about 0.4 mm.

12. The apparatus of claim 8, wherein the plurality of clips reduce electromagnetic interference generated by the plurality of electronics by providing robust electromagnetic compatibility (EMC) between the electronics-based module and the panel.

13. The apparatus of claim 7, wherein the plurality of clips enable thermal energy to be transmitted from the electronics to a first portion of the vehicle by providing thermal contact between the electronics module and the panel.

14. An apparatus comprising:

an electronics unit including a plurality of electronics positioned therein that generate electromagnetic interference (EMI), the electronics unit further including:

a housing defining a plurality of openings positioned on a first side thereof; and a plurality of clips being attached to the housing, wherein a corresponding clip of the plurality of clips is positioned in a corresponding opening of the plurality of openings for attachment to a vehicle, wherein each clip includes a base, a support extending outwardly from the base, and a first projection and a second projection both extending from a distal end of the support toward the base at an angle of 45 degrees or less relative to the support when the clip is fully seated into an opening of a panel, and wherein outer ends of the first projection and the second projection are configured to compress inward toward the support upon insertion into the panel and retract or spring back in response to being fully received into the panel, thereby retaining the plurality of clips and the housing fixed to the panel, wherein the plurality of clips mitigates the EMI, when the electronics unit is attached to the vehicle.

15. The apparatus of claim 14, wherein the plurality of electronics generate thermal energy, and wherein the plurality of clips enables the thermal energy to be transmitted from the electronics to a first portion of the vehicle.

16. The apparatus of claim 14, wherein each clip includes at least three projections that protrude from the corresponding opening and wherein the first projection and the second projection extend in opposite directions from the support.

17. The apparatus of claim 14, wherein the first projection as positioned on the support is offset from the second projection as positioned on the support.

18. The apparatus of claim 14, wherein the plurality of clips each has a width of about 7.5 mm to about 11.5 mm and a thickness of about 0.1 mm to about 0.4 mm.

19. The apparatus of claim 14, wherein the plurality of clips reduce EMI generated by the plurality of electronics by providing robust electromagnetic compatibility (EMC) between the electronics-based module and the panel.

20. The apparatus of claim 15, wherein the plurality of clips enable thermal energy to be transmitted from the electronics to a first portion of the vehicle by providing thermal contact between the electronics module and the panel.

* * * * *